(12) United States Patent
Ong (10) Patent No.: US 8,625,339 B2
(45) Date of Patent: Jan. 7, 2014

(54) MULTI-CELL PER MEMORY-BIT CIRCUIT AND METHOD

(75) Inventor: Adrian E. Ong, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 331 days.

(21) Appl. No.: 13/083,854

(22) Filed: Apr. 11, 2011

(65) Prior Publication Data

US 2012/0257448 A1 Oct. 11, 2012

(51) Int. Cl.
*G11C 11/14* (2006.01)

(52) U.S. Cl.
USPC ........................................................ 365/171

(58) Field of Classification Search
USPC ........................................................ 365/171
See application file for complete search history.

(56) References Cited

U.S. PATENT DOCUMENTS

| | | | |
|---|---|---|---|
| 5,612,963 A * | 3/1997 | Koenemann et al. ......... | 714/739 |
| 5,825,372 A * | 10/1998 | Artieri ........................... | 345/566 |
| 5,983,380 A * | 11/1999 | Motika et al. .................. | 714/733 |
| 6,278,685 B1 * | 8/2001 | Yonge et al. .................. | 370/203 |
| 6,421,293 B1 | 7/2002 | Candelier et al. | |
| 6,552,928 B1 | 4/2003 | Qi et al. | |
| 6,590,825 B2 | 7/2003 | Tran et al. | |
| 6,842,361 B2 | 1/2005 | Miyatke et al. | |
| 7,394,685 B2 | 7/2008 | Ooishi et al. | |
| 7,742,329 B2 | 6/2010 | Yoon et al. | |
| 7,936,592 B2 | 5/2011 | Wang et al. | |
| 8,339,428 B2 * | 12/2012 | Ng ................................. | 345/691 |
| 8,464,137 B2 * | 6/2013 | Franceschini et al. ........ | 714/773 |
| 2003/0074615 A1 * | 4/2003 | Lin et al. ....................... | 714/728 |
| 2006/0056223 A1 * | 3/2006 | Ditewig et al. ................ | 365/145 |
| 2008/0189588 A1 | 8/2008 | Tanaka et al. | |
| 2008/0215954 A1 | 9/2008 | Oshikiri | |
| 2011/0016276 A1 * | 1/2011 | Wang ............................. | 711/133 |
| 2012/0243291 A1 * | 9/2012 | Gopalakrishnan ............ | 365/145 |

OTHER PUBLICATIONS

Notice of Allowance for U.S. Appl. No. 12/558,451 mailed on Aug. 11, 2011.
Notice of Allowance for U.S. Appl. No. 12/544,189 mailed on Aug. 24, 2011.

* cited by examiner

*Primary Examiner* — Hoai V Ho
*Assistant Examiner* — Pablo Huerta
(74) *Attorney, Agent, or Firm* — Renaissance IP Law Group LLP (57) ABSTRACT

A write circuit is adapted to provide a same logical bit to each of a multitude of memory cells for storage. Each of the multitude of memory cells stores either the bit or a complement of the bit in response to the write circuit. A read circuit is adapted to receive the bits stored in the multitude of memory cells and to generate an output value defined by the stored bits in accordance with a predefined rule. The predefined rule may be characterized by a statistical mode of the bits stored in the plurality of memory cells. Storage errors in a minority of the multitude of memory cells may be ignored at the cost of lower memory density. The predefined rule may be characterized by a first weight assigned to bits 1 and a second weight assigned to bits 0.

27 Claims, 9 Drawing Sheets

MULTI-CELL PER MEMORY-BIT CIRCUIT AND METHOD

STATEMENT AS TO RIGHTS TO INVENTIONS MADE UNDER FEDERALLY SPONSORED RESEARCH OR DEVELOPMENT

This invention was made with U.S. Government support under Grant/Contract No. HR0011-09-C-0023 awarded by the DARPA. The U.S. Government retains certain rights in this invention.

CROSS-REFERENCES TO RELATED APPLICATIONS

This application is related to commonly assigned U.S. Patent Application No. 61/363,576, filed Jul. 12, 2010; commonly assigned U.S. Patent Application No. 61/352,306, filed Jun. 7, 2010; commonly assigned U.S. patent application Ser. No. 12/558,451, filed Sep. 11, 2009; commonly assigned U.S. patent application Ser. No. 12/544,189, filed Aug. 19, 2009; commonly assigned U.S. patent application Ser. No. 12/903,152, filed Oct. 12, 2010; commonly assigned U.S. patent application Ser. No. 13/013,616, filed Jan. 25, 2011, and commonly assigned U.S. Patent Provisional Application 61/470,013, filed Apr. 11, 2011, titled "METHOD AND DESIGN FOR HIGH PERFORMANCE NON-VOLATILE MEMORY", the contents of all of which are incorporated herein by reference in their entirety.

BACKGROUND

The present invention relates to memory integrated circuits, and more particularly to memory circuits that ignore storage errors in random access memory.

Semiconductor memory devices have been widely used in electronic systems to store data. There are generally two types of semiconductor memories, including non-volatile and volatile memories. A volatile memory device, such as a Static Random Access Memory (SRAM) or a Dynamic Random Access Memory (DRAM) device, loses its data when the power applied to it is turned off. In contrast, a non-volatile semiconductor memory device, such as a Flash, Erasable Programmable Read Only Memory (EPROM) or a magnetic random access memory (MRAM), retains its charge even after the power applied thereto is turned off. Therefore, where loss of data due to power failure or termination is unacceptable, a non-volatile memory is used to store the data.

Figure 1A:
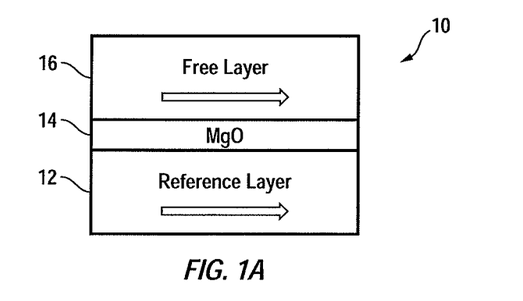
FIG. 1A is a simplified cross-sectional view of a magnetic tunnel junction structure of a magnetic random access memory cell when placed in a parallel magnetization state, as known in the prior art.
Figure 1B:
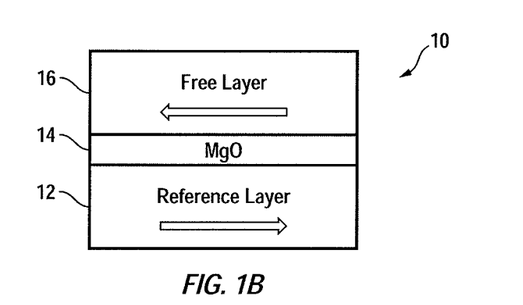
FIG. 1B shows the magnetic tunnel junction structure of FIG. 1A when placed in an anti-parallel magnetization state, as known in the prior art.
Figure 1C:
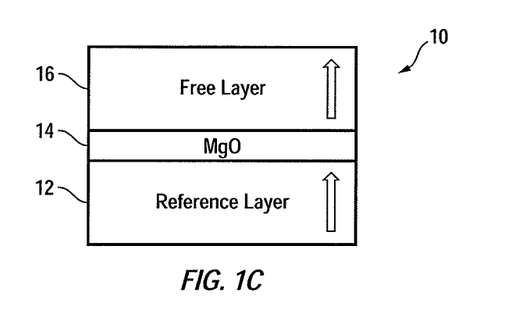
FIG. 1C is a simplified cross-sectional view of a magnetic tunnel junction structure of a magnetic random access memory (MRAM) cell when placed in a parallel magnetization state, as known in the prior art.
Figure 1D:
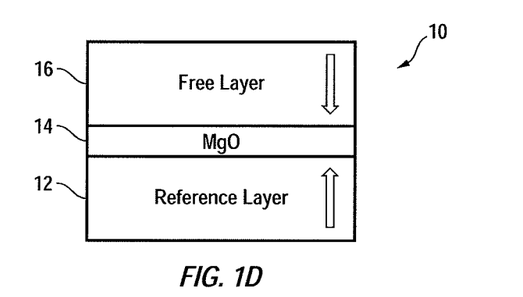
FIG. 1D shows the magnetic tunnel junction structure of FIG. 1D when placed in an anti-parallel magnetization state, as known in the prior art.

FIG. 1A is a simplified cross-sectional view of a magnetic tunnel junction (MTJ) structure 10 used in forming a spin transfer torque (STT) MRAM cell. MTJ 10 is shown as including, in part, a reference layer 12, a tunneling layer 14, and a free layer 16. Reference layer 12 and free layer 16 are ferromagnetic layers. Tunneling layer 14 is a nonmagnetic layer. The direction of magnetization of reference layer 12 is fixed and does not change. The direction of magnetization of free layer 16, however, may be varied by passing a sufficiently large current through the MTJ structure. In FIG. 1A, reference layer 12 and free layer 16 are assumed to have the same magnetization direction, i.e., they are in a parallel state. In FIG. 1B, reference layer 12 and free layer 16 are assumed to have opposite magnetization directions, i.e., they are in an anti-parallel state. In FIG. 1C, reference layer 12 and free layer 16 are assumed to have the same magnetization direction perpendicular to a plane defined by the interface of free layer 16 and tunneling layer 14. In FIG. 1D, reference layer 12 and free layer 14 are assumed to have opposite magnetization directions perpendicular to a plane defined by the interface of free layer 16 and tunneling layer 14.

To switch from the parallel state, as shown in FIG. 1A, to the anti-parallel state, as shown in FIG. 1B, the voltage potential of reference layer 12 is increased relative to that of free layer 16. This voltage difference causes spin polarized electrons flowing from free layer 16 to reference layer 12 to transfer their angular momentum and change the magnetization direction of free layer 16 to the anti-parallel state, as shown in FIG. 1B. To switch from the anti-parallel state to the parallel state, the voltage potential of free layer 16 is increased relative to that of reference layer 12. This voltage difference causes spin polarized electrons flowing from reference layer 12 to free layer 16 to transfer their angular momentum and change the magnetization direction of free layer 16 to the parallel state, as shown in FIG. 1A.

To switch from the parallel state to the non-parallel state or vice versa, the voltage applied to MTJ 10 and the corresponding current flowing through MTJ must be greater than a respective pair of threshold values. The voltage that must exceed a threshold voltage in order for the switching to occur is also referred to as the switching voltage $V_c$. Likewise, the current that must exceed a threshold current in order for the switching to occur is referred to as the switching current $I_c$. As is well known, when free layer 16 and reference layer 12 have the same magnetization direction (parallel state), MTJ 10 has a relatively low resistance. Conversely, when free layer 16 and reference layer 12 have the opposite magnetization direction (anti-parallel state), MTJ 10 has a relatively high resistance. Due to the physical properties of an MTJ, the critical current required to change the state of an MTJ from a parallel to an anti-parallel is often greater than the critical current required to change the state of the MTJ from an anti-parallel to a parallel state.

Figure 2A:
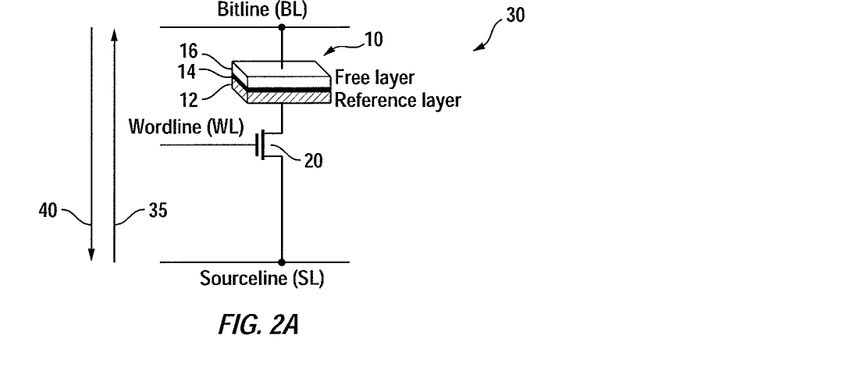
FIG. 2A shows a number of layers of a magnetic tunnel junction structure coupled to an associated select transistor, as known in the prior art.

FIG. 2A shows an MTJ 10 and an associated select transistor 20 together forming an STT-MRAM cell 30. Transistor 20 is often an NMOS transistor due to its inherently higher current drive, lower threshold voltage, and smaller area relative to a PMOS transistor. As is described further below, the current used to write a "1" in MRAM 30 is different than the current used to write a "0". The asymmetry in the direction of current flow during these two write conditions is caused by the asymmetry in the gate-to-source voltage of transistor 20. Accordingly, a write driver adapted to deliver sufficient current to write a "0", may not be able to provide enough current to write a "1". Similarly, a write driver adapted to deliver sufficient current to write a "1" may deliver a current that is greater than what would otherwise be an acceptable current level to write a "0".

Figure 2B:
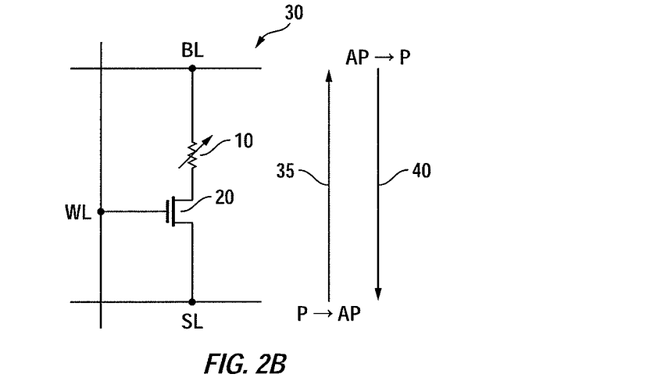
FIG. 2B is a schematic representation of the magnetic tunnel junction structure and its associated select transistor of FIG. 2A, as known in the prior art.

In the following description, an MRAM cell is defined as being in a logic "0" state when the free and reference layers of its associated MTJ are in a parallel (P) state, i.e., the MTJ exhibits a low resistance. This low resistance state is also alternatively shown as $R_{low}$ or $R_P$ state. Conversely, an MRAM cell is defined as being in a logic "1" state when the free and reference layers of its associated MTJ are in an anti-parallel (AP) state, i.e., the MTJ exhibits a high resistance. This high resistance state is also alternatively shown as $R_{high}$ or $R_{AP}$ state. Furthermore, in the following, it is assumed that the reference layer of the MTJ faces its associated select transistor, as shown in FIG. 2A. Therefore, in accordance with the discussion above, a current flowing along the direction of arrow 35 (the up direction) (i) either causes a switch from the P state to the AP state thus to write a "1", (ii) or stabilizes the previously established AP state of the associated MTJ. Likewise, a current flowing along the direction of arrow 40 (the down direction) (i) either causes a switch from the AP state to the P state thus to write a "0", (ii) or stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 (i) either causes a switch from the AP state to the P, (ii) or stabilizes the previously established P state of the associated MTJ. Likewise, in such embodiments, a current flowing along the direction of arrow 40 (i) either causes a switch from the P state to the AP state, (ii) or stabilizes the previously established AP state. FIG. 2B is a schematic representation of MRAM 30 of FIG. 2A in which MTJ 10 is shown as a storage element whose resistance varies depending on the data stored therein. The MTJ changes its state (i) from P to AP when the current flows along arrow 35, and (ii) from AP to P when the current flows along arrow 40.

Figure 3:
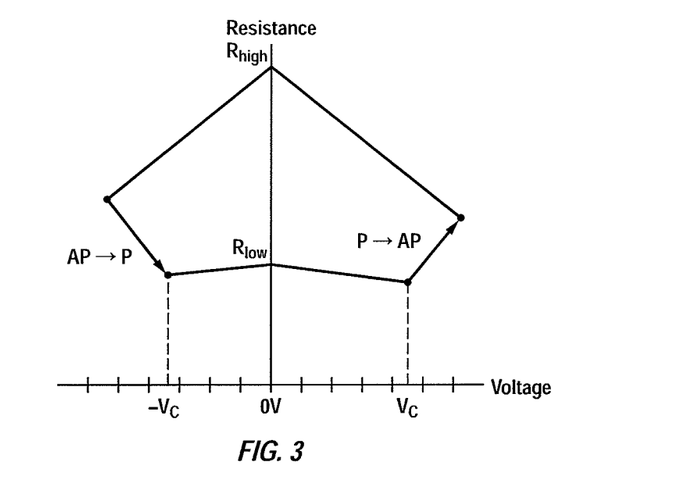
FIG. 3 shows the variation in the resistance of the magnetic tunnel junction structure of FIG. 2A in response to applied voltages, as known in the prior art.

As described above, the voltage required to switch an MTJ from an AP state to a P state, or vice versa, must exceed a critical value Vc. The current corresponding to this voltage is referred to as the critical current Ic. FIG. 3 represents the variation in the MTJ state (or its resistance) during various write cycles. To transition from the P state (low resistance state) to AP state (high resistance state), a positive voltage of Vc is applied. Once in the AP state, removing the applied voltage does not affect the state of the MTJ. Likewise, to transition from the AP state to the P state, a negative voltage of Vc is applied. Once in the P state, removing the applied voltage does not affect the state of the MTJ. The resistance of the MTJ is $R_{high}$ when it is in AP state and receives no or very small voltage. Likewise, the resistance of the MTJ is $R_{low}$ when it is in P state and receives no or very small voltage.

Figure 4A:
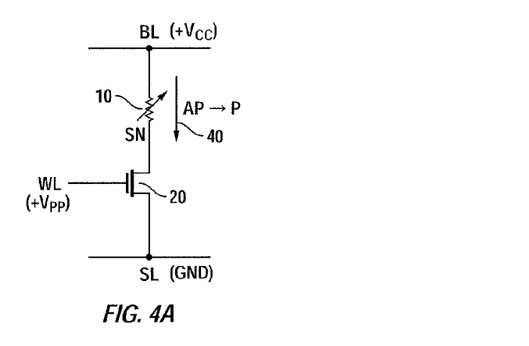
FIGS. 4A-4B show a magnetic tunnel junction structure being programmed to switch from an anti-parallel state to a parallel state, as known in the prior art.

FIG. 4A shows an MTJ 10 being programmed to switch from an anti-parallel state (i.e., high resistance state, or logic "1" state) to a parallel state so as to store a "0" (i.e., low resistance state, or logic "0" state). It is assumed that MTJ 10 is initially in a logic "1" or AP state. As described above, to store a "0", a current $I_c$ greater than the critical current is caused to flow through transistor 20 in the direction of arrow 40. To achieve this, the source node (SL) of transistor 20 is coupled to the ground potential via a resistive path (not shown), a positive voltage Vpp is applied to the gate node (WL or wordline) of transistor 20, and a positive voltage $V_{cc}$ is applied to the drain node (BL or bitline) of transistor 20.

Figure 4B:
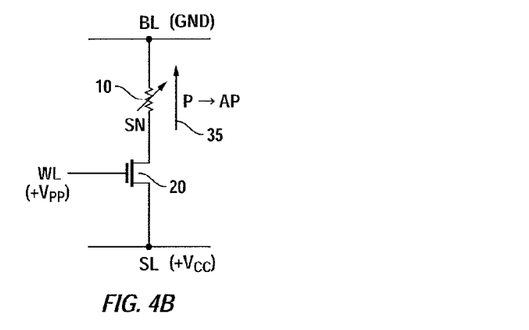
Figure 5:
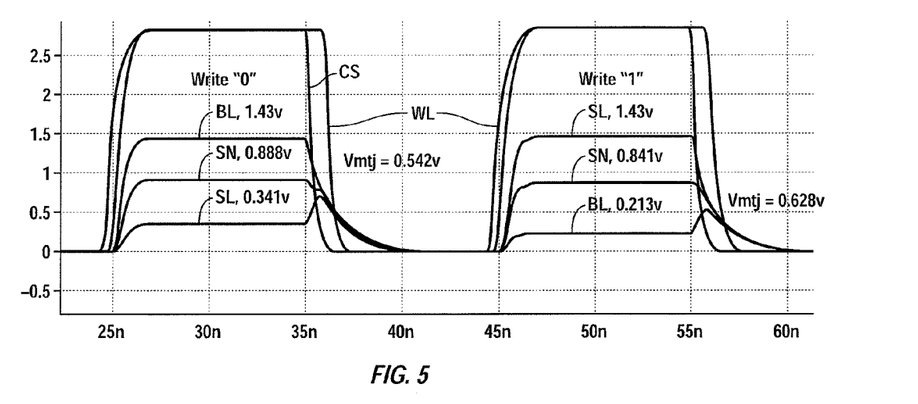
FIG. 5 is an exemplary timing diagram of a number of signals associated with a magnetic random access memory during write "0" and write "1" operations, as known in the prior art.

FIG. 5 is an exemplary timing diagram of the voltage levels at nodes WL, SL, SN and BL during write "0" operation, occurring approximately between times 25 ns and 35 ns, and write "1" operation, occurring approximately between times 45 ns and 55 ns, for a conventional MTJ such as MTJ 10 shown in FIGS. 4A and 4B. Supply voltage $V_{CC}$ is assumed to be 1.8 volts. Signal WL, as well as signal CS which is a column select signal, are shown as having been boosted to a higher Vpp programming voltage of 3.0 volts. During the write "0" operation, the voltages at nodes BL, SL and SN are shown as being approximately equal to 1.43 V, 0.34 V, and 0.88 V respectively. During the write "1" operation, the voltages at nodes BL, SL and SN are shown as being approximately equal to 0.23 V, 1.43 V, and 0.84 V respectively. Although not shown, for this exemplary computer simulation, the currents flowing through the MTJ during write "0" and "1" operations are respectively 121 μA and 99.2 μA.

FIG. 4B shows an MTJ being programmed to switch from a parallel state to an anti-parallel state so as to store a "1". It is assumed that MTJ 10 is initially in a logic "0" or P state. To store a "1", a current L greater than the critical current is caused to flow through transistor 20 in the direction of arrow 35. To achieve this, node SL is supplied with the voltage $V_{cc}$ via a resistive path (not shown), node WL is supplied with the voltage Vpp, and node BL is coupled to the ground potential via a resistive path (not shown). Accordingly, during a write "1" operation, the gate-to-source voltage of transistor 20 is set to ($V_{WL}$-$V_{SN}$), and the drain-to-source voltage of transistor 20 is set to ($V_{SL}$-$V_{SN}$).

Because the gate-to-source and drain-to-source voltages of transistor 20 are higher under the conditions described with reference to FIGS. 4A and 5 than they are under the conditions described with reference to FIGS. 4B and 5, the corresponding current flow through the MTJ is higher when attempting to write a logic "0" than a logic "1". Accordingly, the voltages designed to generate the critical current needed to carry out a write "0" operation may not be sufficient to carry out a write "1" operation. An undesirable asymmetry thus exists in the current levels during write "1" and write "0" operations. Consequently, a transistor size selected to provide sufficient current to write a "0" may not provide enough current to write a "1". Alternatively, a larger transistor size selected to provide the required current to write a "1", may result in generation of excessive current when writing a "0". Such an excess current may damage the tunneling layer of the MTJ shown in FIG. 1.

During redundancy operation, a memory chip may be tested and repaired at the factory (or by the seller) by determining the address locations of defective cells. The defective address locations are then mapped out of the final usable address space by replacing entire rows and/or columns in the regular memory array with redundant rows and/or columns provided on the same chip. The redundancy mapping is accomplished by setting content addressable memory (CAM) bits granular only at the row and/or column level within the addressing/decoding circuitry. The redundancy operation is normally done by special test operation modes that are not made available to the memory's end-user so the memory producer may maintain control of the product quality. Once in the field, memory address locations mapped out by redundancy stay mapped out for the life of the part. In contrast, during normal write operation by an end-use, memory address locations are granular by individual cell and reusable (except for the case of permanently altered memory such as ROM or PROM). Thus, redundancy operations are different than normal write operations done by the end-user.

Error correction codes (ECC) are used to logically process the values of multiple logical bits that are grouped in fixed sized blocks, such as a byte, to be written in a memory. The ECC logic generates additional encoded logical bit values called a checksum or ECC to be stored additionally with the original byte. Each value in the checksum or ECC may be different depending on the values in the byte and the encoding algorithm. The ECC encoding takes additional circuitry and slows performance but enables errors in the original byte to be detected and/or corrected depending on the number of bit errors in the byte, type of encoding and number of additional bits used.

BRIEF SUMMARY

According to one embodiment of the present invention, a memory circuit includes a write circuit adapted to provide a same bit to each of a multitude of memory cells for storage. In response to being provided the same bit, each of the multitude of memory cells stores either the bit or a complement of the bit. A read circuit is adapted to receive the bits stored in the multitude of memory cells and to generate an output value defined by the stored bits in accordance with a predefined rule.

According to one specific embodiment, the predefined rule is characterized by a statistical mode of the bits stored in the multitude of memory cells. According to another specific embodiment, the predefined rule is characterized by a first weight assigned to bits 1 and a second weight assigned to bits 0.

According to another specific embodiment, the memory circuit further includes a word-line and two or more columns. Each of the two or more memory cells is coupled to the word-line and to corresponding ones of the two or more columns.

According to another specific embodiment, one of the two or more memory cells is a DRAM, SRAM, ROM, PROM, EEPROM, FLASH, FeRAM, PRAM, MRAM, STT-MRAM, or ReRAM (resistive RAM) cell.

According to another specific embodiment, the output value is generated by one of a multitude of selectable logic circuits and the selection of the logic circuit is made by a program input.

According to another specific embodiment, the memory circuit further includes two or more sense amplifiers. Each of the two or more memory cells is coupled to corresponding ones of the two or more sense amplifiers and the output of each of the two or more sense amplifiers is coupled to the input of a logic circuit.

According to another specific embodiment, the two or more memory cells are adjacently located. According to another specific embodiment, the two or more memory cells are non-adjacently located.

According to another specific embodiment, each of the two or more columns includes a first signal line and a second signal line. One of the two or more memory cells includes: (i) a first current carrying terminal coupled to the first signal line, (ii) a second current carrying terminal coupled to the second signal line, and (iii) a control terminal coupled to the word-line.

According to another specific embodiment, the non-selected ones of the multitude of selectable logic circuits are powered down.

According to another specific embodiment, each of the two or more memory cells is coupled to a first current carrying terminal of a corresponding first transistor. A second current carrying terminal of the corresponding first transistor is coupled to the input of the corresponding ones of the two or more sense amplifiers. A control terminal of each of the corresponding first transistors is coupled to a first signal line.

According to another specific embodiment, one of the two or more memory cells further includes a magnetic tunnel junction having a first terminal coupled to the first current carrying terminal of one of the two or more memory cells. A first transistor includes: (i) a first current carrying terminal coupled to the second current carrying terminal of one of the two or more memory cells, (ii) a gate terminal coupled to the control terminal of one of the two or more memory cells, and (iii) a second current carrying terminal coupled to a second terminal of said magnetic tunnel junction.

According to one embodiment of the present invention, a method of operating a memory circuit includes providing a same bit to each of a multitude of memory cells, each of the multitude of memory cells storing either the bit or a complement of the bit in response. The bits stored in the plurality of memory cells are received. An output value is generated. The output value is defined by the stored bits in accordance with a predefined rule.

According to one specific embodiment, the method of operating a memory circuit further includes characterizing the predefined rule by a statistical mode of the bits stored in the multitude of memory cells. According to another specific embodiment, the method of operating a memory circuit further includes characterizing the predefined rule by a first weight assigned to bits 1 and a second weight assigned to bits 0.

According to another specific embodiment, the method of operating a memory circuit further includes coupling the two or more memory cells to a word-line and to corresponding ones of two or more columns.

According to another specific embodiment, the method of operating a memory circuit further includes providing one of the two or more memory cells as a DRAM, SRAM, ROM, PROM, EEPROM, FLASH, FeRAM, PRAM, MRAM, STT-MRAM, or ReRAM (resistive RAM) cell.

According to another specific embodiment, the method of operating a memory circuit further includes generating the output value by selecting one of a multitude of selectable logic circuits and selecting the logic circuit by a program input.

According to another specific embodiment, the method of operating a memory circuit further includes coupling each of the two or more memory cells to corresponding ones of a multitude of sense amplifiers and coupling the output of each of the multitude of sense amplifiers to the input of a logic circuit.

According to another specific embodiment, the method of operating a memory circuit further includes locating the two or more memory cells adjacently. According to another specific embodiment, the method of operating a memory circuit further includes locating the two or more memory cells non-adjacently.

According to another specific embodiment, the method of operating a memory circuit further includes: (i) forming each of the two or more columns from a first signal line and a second signal line, and (ii) coupling a first current carrying terminal of one of the two or more memory cells to the first signal line. The method of operating a memory circuit further includes: (i) coupling a second current carrying terminal of one of the two or more memory cells to the second signal line, and (ii) coupling a control terminal of one of the two or more memory cells to the word-line.

According to another specific embodiment, the method of operating a memory circuit further includes powering down the non-selected ones of the multitude of selectable logic circuits.

According to another specific embodiment, the method of operating a memory circuit further includes: (i) coupling each of the two or more memory cells to a first current carrying terminal of a corresponding first transistor, (ii) coupling a second current carrying terminal of the corresponding first transistor to the input of the corresponding ones of the two or more sense amplifiers, and (iii) coupling a control terminal of each of the corresponding first transistors to a first signal line.

According to another specific embodiment, the method of operating a memory circuit further includes: (i) coupling a first terminal of a magnetic tunnel junction to the first current carrying terminal of one of the two or more memory cells, and (ii) coupling a first current carrying terminal of a first transistor to the second current carrying terminal of one of the two or more memory cells. The method of operating a memory circuit further includes: (i) coupling a gate terminal of the first transistor to the control terminal of one of the two or more memory cells, and (ii) coupling a second current carrying terminal of the first transistor to a second terminal of the magnetic tunnel junction.

A better understanding of the nature and advantages of the present invention may be gained with reference to the following detailed description and the accompanying drawings.

DETAILED DESCRIPTION

During write operation, a memory cell may exhibit randomly different write times at different occasions even under the same, stable conditions. Such behavior may not result from wear-out mechanisms that could be screened out during factory testing, but instead, results from probabilistic behavior of the memory cell's write characteristics. Memory cells determined to be defective for non-probabilistic reasons may be removed from a cell population by testing at the factory (by the seller) to scrap bad chips or repair defects by replacing defective cells with redundant cells on-chip during the memory repair step. However, the remaining population may still exhibit probabilistic behavior. Alternatively, after factory shipment to the field and if the chip is in regular use by the end-user, memory systems may be able to flag address locations corresponding to slow to write cells, mapping them out of the usable address space. The end-user mapping of slow to write cells results in a dwindling number of usable address locations over time, since the mapped out cells are not expected to recover to normal. Thus, probabilistic cell behavior would result in either, low factory yield due to depleting limited redundant elements, or depleting the usable address space over time in the field.

In particular, during write operation, a memory cell may exhibit randomly different write times at different occasions under stable environmental conditions. This behavior may produce an error during writing data into a memory system at random occasions even for the cell population determined to be otherwise defect free. A new memory circuit solution is desired to overcome the probabilistic cell behavior problem.

In accordance with one embodiment of the present invention, a write circuit is adapted to provide a same logical bit to each of a multitude of memory cells for storage. Each of the multitude of memory cells stores either the bit or a complement of the bit in response to the write circuit. A read circuit is adapted to receive the bits stored in the multitude of memory cells and to generate an output value defined by the stored bits in accordance with a predefined rule. In one embodiment, the predefined rule may be generated by a logic circuit and may be characterized by a statistical mode of the bits stored in the plurality of memory cells. Thus, storage errors in a minority of the physical memory cells (alternatively referred to herein as memory cells or cells), may be ignored at the cost of lower memory density. The storage errors may be due to probabilistic write behavior or due to other storage issues such as data retention errors. In another embodiment, the predefined rule may be characterized by a first weight assigned to bits 1 and a second weight assigned to bits 0. Where one of the values of the logical bit is harder to store in the cell than the other, the predefined rule generated by the logic circuit may decide in favor of the harder to store value. This embodiment includes the previous embodiment's advantages and facilitates ignoring bit storage errors for memory systems with asymmetric storage characteristics.

Figure 6:
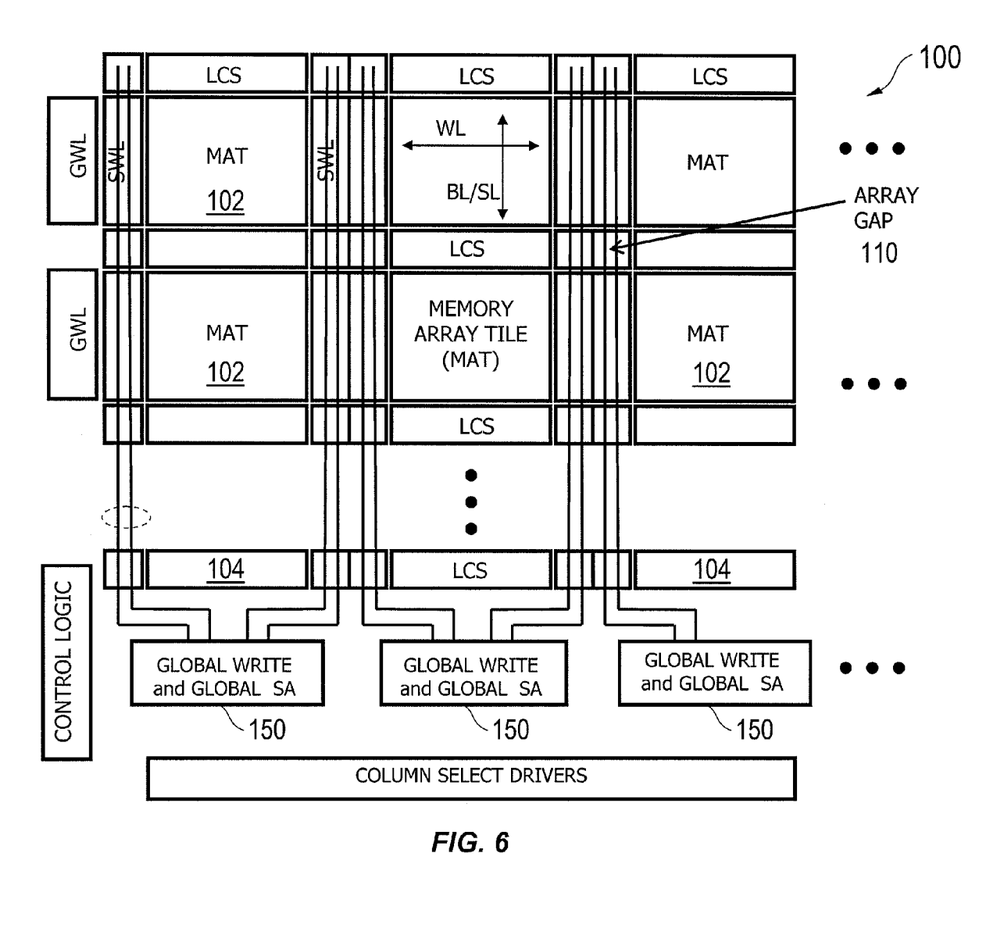
FIG. 6 is an exemplary block diagram of a memory system and associated circuitry, in accordance with one embodiment of the present invention.

FIG. 6 is an exemplary block diagram of a memory system 100 and associated circuitry, in accordance with one embodiment of the present invention. Memory system 100 includes a multitude of array blocks selected by column select drivers, a multitude of global write, a multitude of global sense amps (SA), a multitude of global word line (GWL) circuits, and a control circuit. Each array block may include an array of physical memory cells (memory array tile, or MAT) 102 whose rows are selected by one or more sub word line (SWL) circuits, and whose columns are selected by one or more local column select circuits (LCS) 104. The corners of each block include an array gap area 110 to be described in further detail below. It should be noted the terms sensing and reading may be used interchangeably herein, as are the terms sense and read.

Memory array tile 102 includes many columns, wordlines and cells located at the intersections of the columns and wordlines. Each cell is capable of storing a logical data bit, which corresponds to a value of logical 1 or logical 0. By way of example, some of the embodiments described below will use STT-MRAM cells previously described. For example, the physical memory cell may be a DRAM, SRAM, ROM, PROM, EEPROM, FLASH, FeRAM, PRAM, MRAM, ReRAM, STT-MRAM, or ReRAM (resistive RAM) cell depending on the technology.

Figure 7:
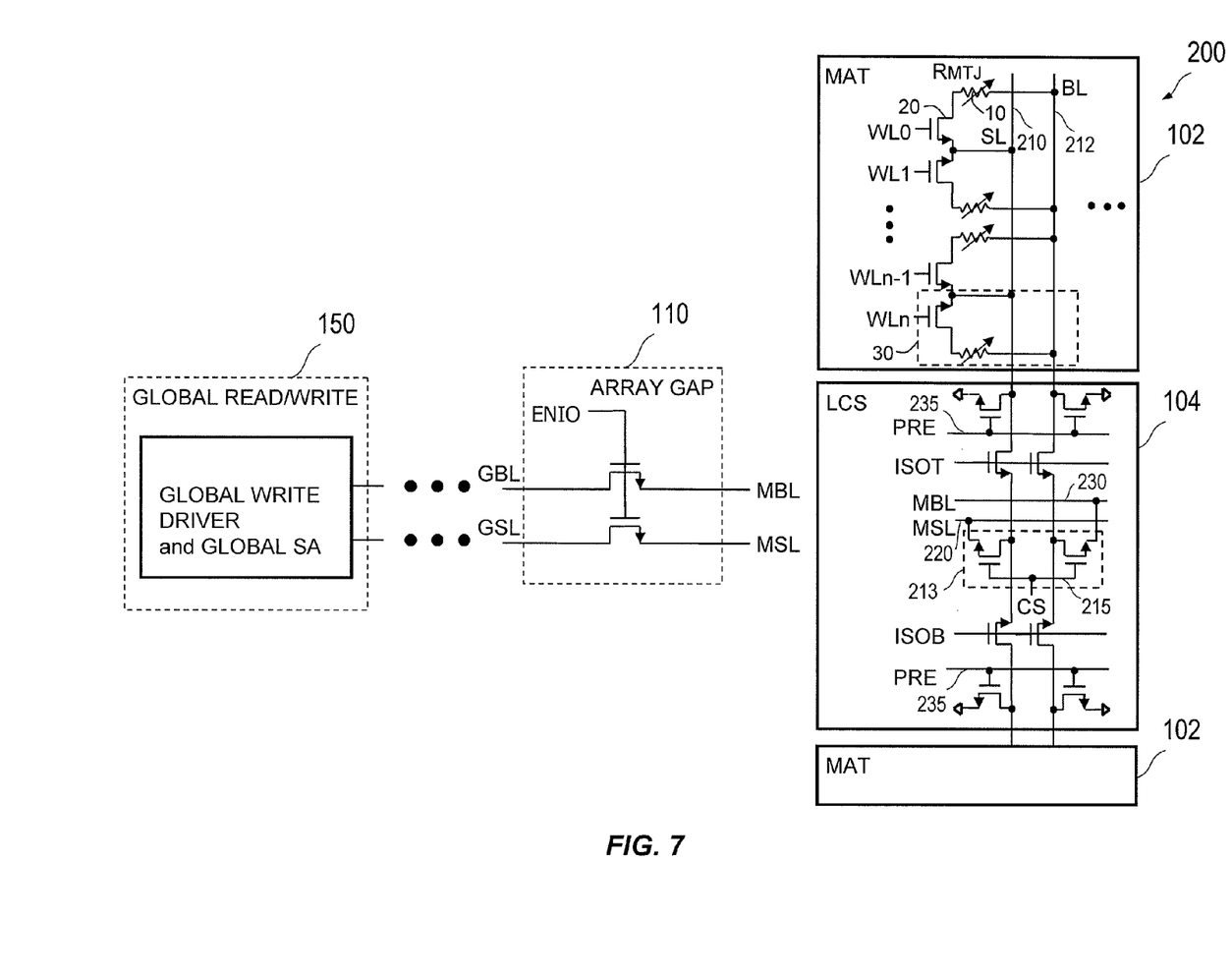
FIG. 7 is a schematic representation of portions of a memory system and associated writing and reading circuitry, in accordance with one embodiment of the present invention.

FIG. 7 is a schematic representation 200 of portions of a memory system 100 and associated writing and reading circuitry, in accordance with one embodiment of the present invention. Schematic representation 200 includes MAT 102, LCS 104, array gap 110, and a global read/write 150. The global SA and global write driver circuitry are included in the Global Read/Write block, which is coupled to GBL and GSL signal lines. GBL and GSL, in turn, are coupled to MBL and MSL, respectively, through a pair of pass transistors in the array gap block under the control of signal ENIO generated by the control logic block. In alternative embodiments, the write driver and/or read circuits may be located in the array gap (not shown).

MAT 102 includes a number of MRAM cells 30 whose select transistors are coupled to word lines WL0-WLn driven by the SWL circuits and the GWL circuits described above in connection with FIG. 6. In reference to FIG. 7, the multitude of MRAM cells 30 are also coupled to a source line (SL) 210 and a bit line (BL) 212 pair, which may form part of the column. The MAT includes a multitude of SL and BL pairs selectable by LCS 104.

The LCS includes pairs of n-channel select transistors 213 which couple a selected SL and BL pair in MAT 102 to a pair of MSL 220 and MBL 230 lines under control of a column select (CS) 215, a precharge (PRE) 235, an isolation top (ISOT), and an isolation bottom (ISOB) signal. The LCS determines whether to couple adjacent MAT 102 above or below the LCS by enabling one of the respective ISOT or ISOB signals. The top MAT is selected by enabling ISOT and disabling ISOB. One of the multitude of SL and BL pairs is selected by the CS signal driven by the column select drivers, to couple the selected SL and BL pair to the respective MSL and MBL lines. The SL/BL and respective MSL/MBL lines are ready for write or read operation modes when PRE is disabled. MSL 220 and MBL 230 are coupled from LCS 104 to array gap 110.

The example shown in schematic representation 200 includes STT-MRAM cells, but it would be recognized that the embodiment has a broader range of applicability. For example MAT 102 may include other memory cell types as discussed above. In one embodiment, one of the number of cells may include (i) one current carrying terminal coupled to BL 212, (ii) another current carrying terminal coupled to SL 210 and (iii) a control terminal coupled to the word-line. In another embodiment, one current carrying terminal of one of the number of cells may be connected to a power supply or ground potential directly within the MAT without having to be decoded by a column select signal. In this example, the column may include only one signal line such as the BL signal, while the SL signal is connected to a power supply or ground potential within the MAT without decoding. In this embodiment, the LCS may include only one n-channel select transistor to couple the column BL to the global BL through a single MBL line.

Figure 8:
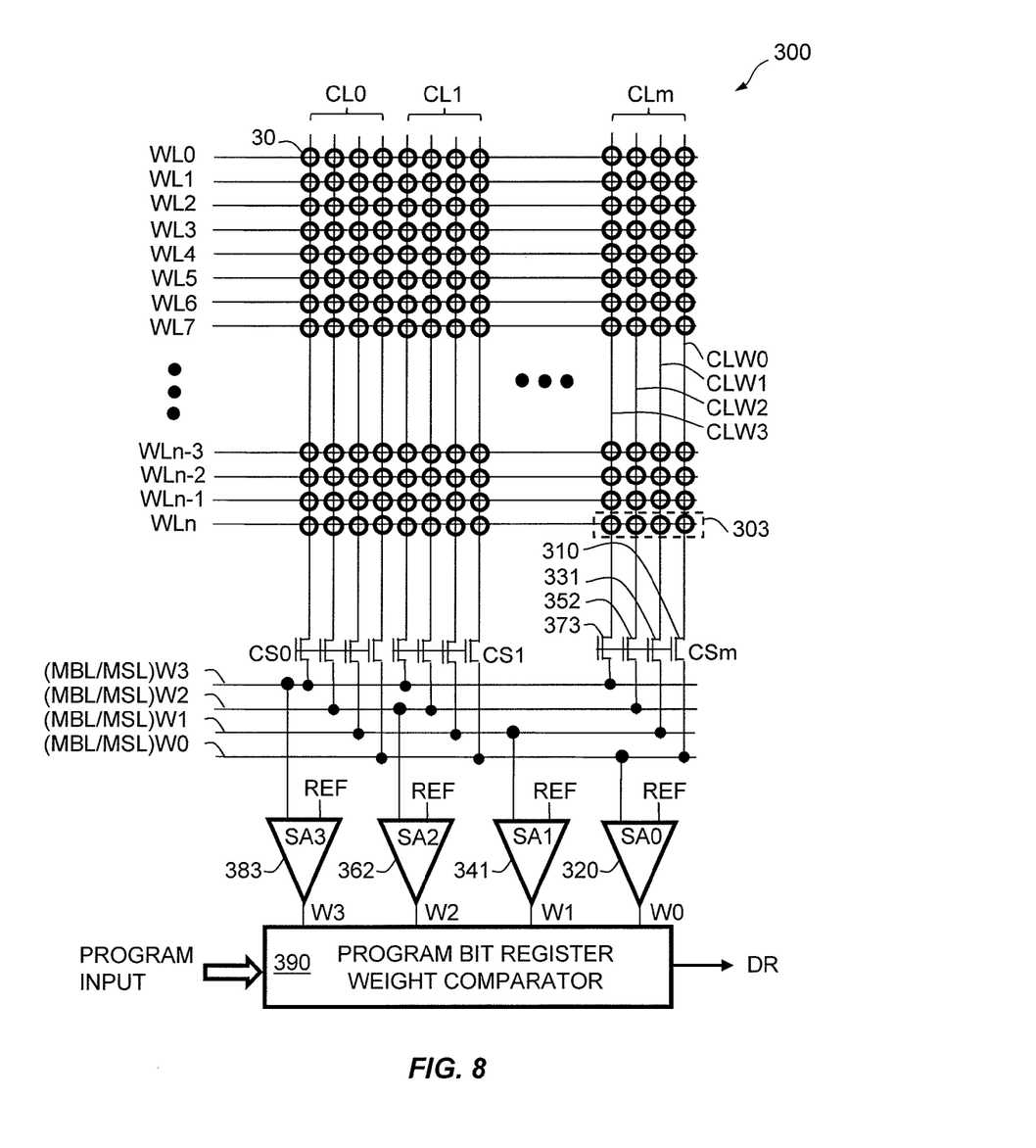
FIG. 8 is a schematic representation of portions of a memory system and associated circuits that ignore storage errors, in accordance with one embodiment of the present invention.

FIG. 8 is a schematic representation 300 of portions of a memory system 100 and associated circuits that ignore storage errors, in accordance with one embodiment of the present invention. Many features shown in FIG. 8 are analogous to FIG. 7 and will not be explained in detail except as described below. The assignment of a logical bit to two or more physical memory cells may be done by assigning two or more physical columns to one logical column. Schematic representation 300 of portions of a memory system 100 and associated circuits that ignore storage errors includes two or more physical columns CLW0-CLWc, where c is an integer with a value of two or more representing the number of cells per logical-bit. The CLW0-CLWc are grouped into a logical column CLm, where m is an integer representing the number of logical columns. Each signal CLWc is analogous to the column pair SL/BL referenced in FIG. 7 and may represent either a pair of lines or a single line as described above depending on the memory cell technology type.

By way of example, c is shown in FIG. 8 with four cells/logical-bit. However, c may be increased to better deal with higher storage error rates, at the cost of reduced memory storage density. Conversely, c may be reduced if storage error rates are low. Each of c physical cells 303, or cells, is coupled to the cell's corresponding physical column, CLWc. A logical bit located at (n,m) is assigned to c physical cells 303, located at the intersection of WLn and logical column CLm. Thus, the total physical memory size is given by the value of n×m×c cells which is able to store n×m logical bits. The memory density is reduced by the factor c compared to conventional single bit per cell memory.

The physical column CLm in MAT 102 is coupled to c signal lines in the LCS called (MBL/MSL)W0-(MBL/MSL)Wc through c n-channel select transistors whose control gates are coupled to signal CSm. For the example shown, (MBL/MSL)W0-(MBL/MSL)W3 are coupled to corresponding physical columns CLW0-CLW3 through four n-channel select transistors 310, 331, 352 and 373 respectively if CSm is selected. Thus, the four cells in the MAT are coupled to (MBL/MSL)W0-(MBL/MSL)W3 in the LCS if WLn and CSm are selected. Each of the n-channel select transistors 310-373 and lines (MBL/MSL)Wc are analogous to n-channel select transistors 213 and lines MBL/MSL referenced in FIG. 7. Therefore, each signal CLWc and (MBL/MSL)Wc may represent either a pair of signal lines or a single line as described above depending on the memory cell technology type.

Referring again to FIG. 8, during write operation, write circuits write a value of a single logical bit at location (n,m) into the c cells on logical column CLm through the bus (MBL/MSL)W0-(MBL/MSL)Wc if WLn and CSm are selected. The write circuit writes the same value of the logical bit in each one of c cells at the selected location (n,m). For example, if the logical bit value to be written in location (n,m) is "1", a value "1" is written into each of the selected c cells. Conversely, if the logical bit value to be written is "0", a "0" is written into each of the selected c cells.

The read circuit may include c SA circuits, SA0-SAc, shown as SA0-SA3 320, 341, 362 and 383 respectively, in this example. During read operation, read circuits read a value of a single logical bit stored at location (n,m) from c cells 303 on logical column CLm through the bus (MBL/MSL)W0-(MBL/MSL)Wc if WLn and CSm are selected. The input of each SAc is coupled to one of the corresponding c cells 303, because the input of each SAc is coupled to a corresponding (MBL/MSL)Wc line. The SAc circuits may be located in the global read/write block or locally in the array gap or LCS. Each SAc circuit may also include a reference REF signal input. The output of each SAc is coupled to a corresponding Wc line, which may carry the value of the logical bit stored in the selected cell on physical column CLWc. Each Wc is coupled to program bit register weight comparator (PBRWC) block 390, which decides and outputs the desired value of the logical bit stored in the selected c cells on a data read DR signal. The decision (alternatively referred to herein as a predefined rule) is generated by logic circuits within the PBRWC that use the Wc signals as inputs and which may be selected by program input signal lines as described below.

The c physical cells 303 and corresponding c n-channel select transistors may be adjacently located on adjacently grouped physical columns within the same MAT as shown. Alternatively, the c physical cells 303 and corresponding c n-channel select transistors may be non-adjacently located on non-adjacently grouped physical columns within the same MAT by routing the CSm signal line to the desired physical column location (not shown). Non-adjacently located cells may improve immunity to radiation induced soft errors, for example.

Figure 9:
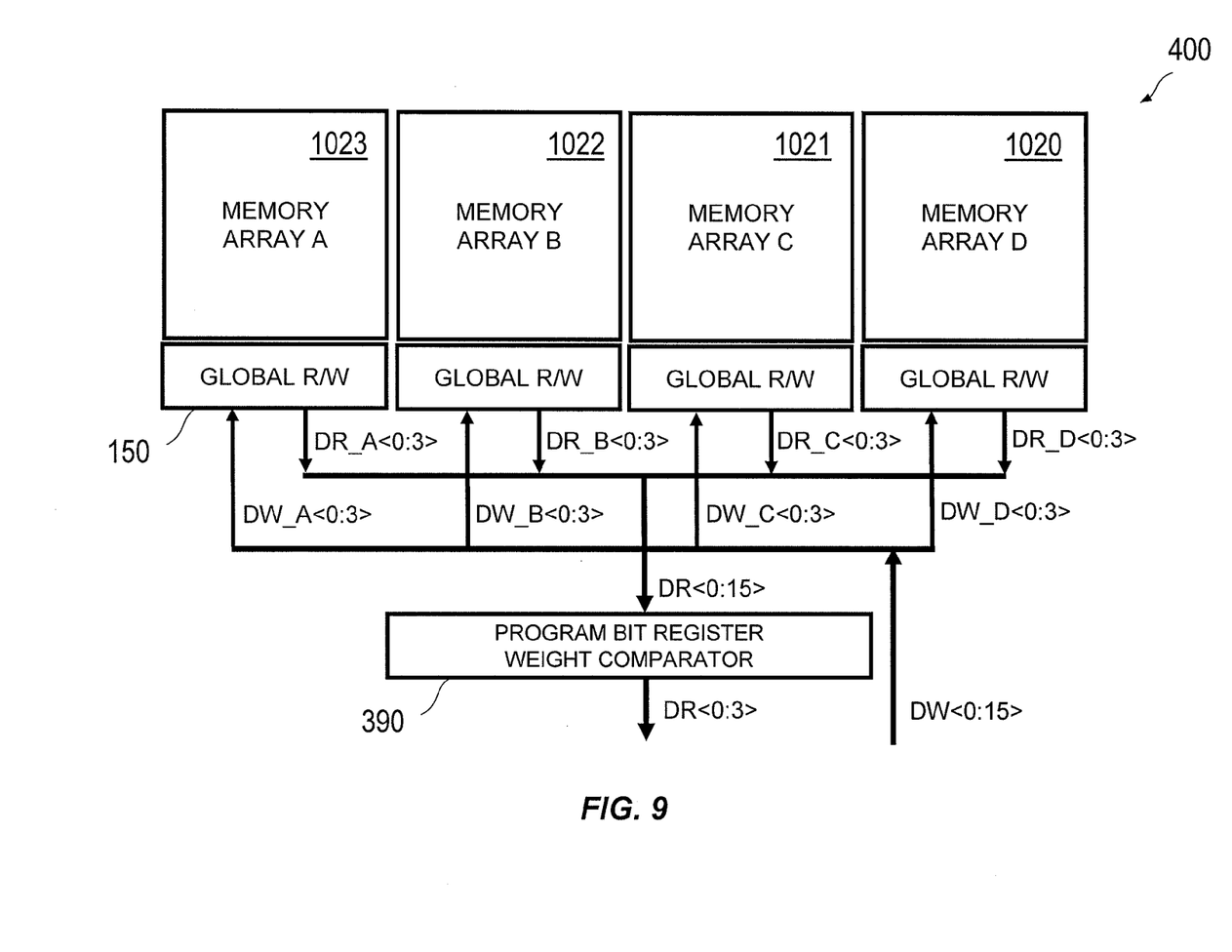
FIG. 9 is a schematic representation of portions of a 4-bit wide memory system and associated program bit register weight comparator circuits, in accordance with another embodiment of the present invention.

FIG. 9 is a schematic representation of portions of a 4-bit wide memory system 400 and associated program bit register weight comparator circuits, in accordance with another embodiment of the present invention. In this example, the c physical cells 303 and corresponding physical columns CLWc are non-adjacently located in c corresponding memory array blocks. By way of example, c is again four cells/logical-bit. Memory system 400 includes c memory arrays A-D 1020-1023 respectively. Each of the c memory arrays may correspond, in part, to the multiple MAT, LCS, SWL and array gap blocks in memory system 100 previously referenced in FIG. 6.

In reference again to FIG. 9, each of the c memory arrays is coupled to a corresponding global R/W 150 block. Each of the c memory arrays and corresponding global R/W have a physical data bus width equal to w, where w is an integer greater than 0. In this example, w is four bits wide so each of the c memory arrays may be able to simultaneously write four physical cells at a time or read four cells at a time. A data write bus DW<0:15> is split into a multitude of c data write buses, or four DW<0:3> buses if c is equal to four, DW_A<0:3>, DW_B<0:3>, DW_C<0:3>, and DW_D<0:3>, which are coupled directly to each of the c global R/W blocks, respectively. A multitude of c data read buses, or four DR<0:3> buses if c is equal to four, DR_A<0:3>, DR_B<0:3>, DR_C<0:3>, and DR_D<0:3> are coupled from each of the c global R/W blocks, respectively, to PBRWC 390 through DR<0:15>. Since each logical bit is assigned to four physical cells, the PBRWC outputs DR<0:3>. Memory system 400 may be a monolithic integrated circuit or a memory system using a multitude of memory integrated circuits.

Figure 10:
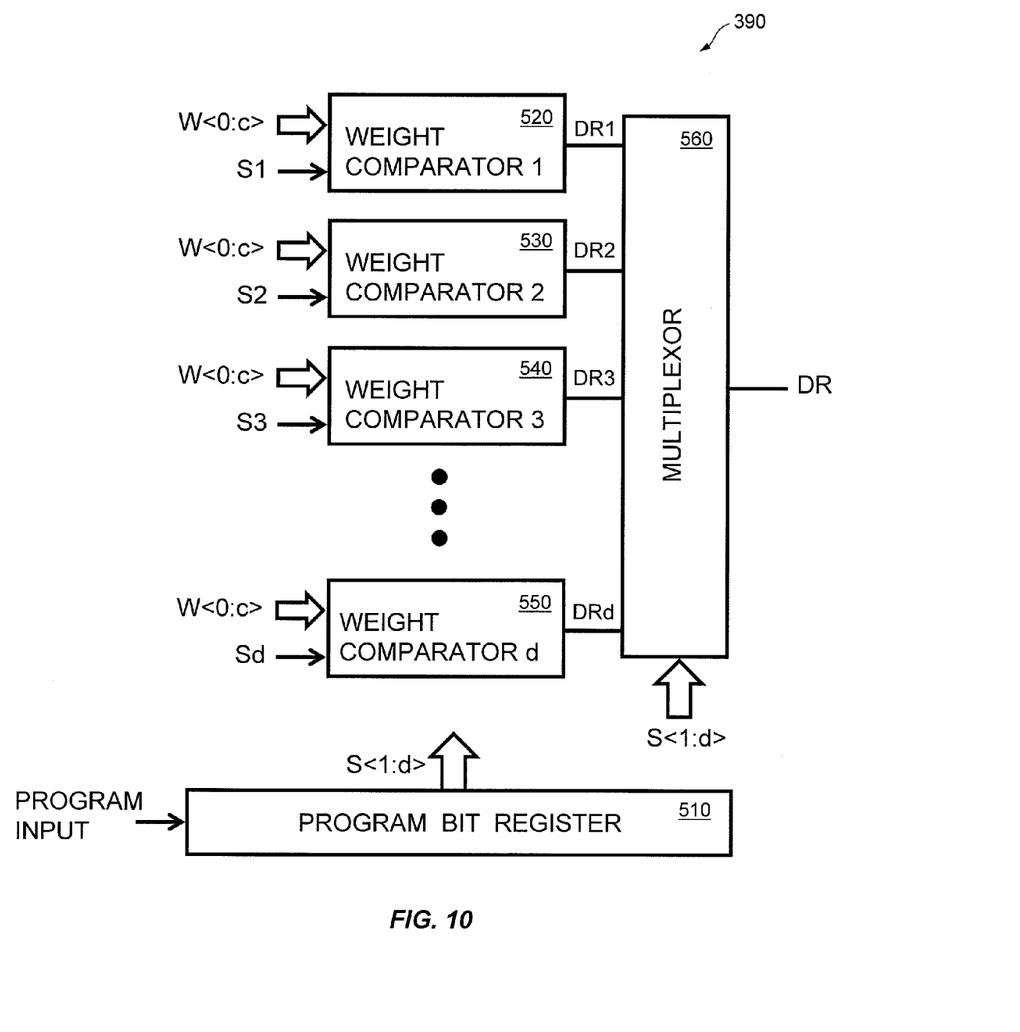
FIG. 10 is a schematic representation of a program bit register weight comparator circuit, in accordance with one embodiment of the present invention.

FIG. 10 is a schematic representation of PBRWC circuit 390 referenced in FIG. 8, in accordance with one embodiment of the present invention. As shown in FIG. 10, PBRWC circuit 390 includes a program bit register 510, a multitude of weight comparators 1-$d$ 520-550, respectively, and a multiplexor 560, where d is a predetermined integer value. The program input is coupled to program bit register (PBR) 510 which may be a volatile or non-volatile, one-time-programmable (OTP) or re-programmable, data register or other circuit type that outputs a d wide selection bus S<1:d>. The program input may be provided during chip manufacture, at electrical test, in similar fashion as memory redundancy is programmed. Alternatively, program input may come directly from signals coupled directly from bond pads.

Each one of the weight comparators d is selected by selecting one of the corresponding S<1:d> or Sd signals. The non-selected weight comparators d are powered down to save energy. Each one of the weight comparators d is a logic circuit that decides the value of the logical bit DR stored in and assigned to the c physical memory cells 303, which are coupled to the weight comparators d via the outputs of the SAc on lines W<0:c>. One of the desired DRd outputs from the weight comparators d is chosen by bus S<1:d> through multiplexor 560, which outputs the corrected value of the logical bit on line DR (alternatively referred to herein as value of DR or DR). Thus, the read circuit is able to decide the value of the logical bit stored in the c physical memory cells in accordance with an output of one of the multitude of weight comparators d and the selection of the weight comparator d is made by a program input. This feature allows flexible selection of a variety of DR decision implementations (to be described below) on the same chip depending on manufacturing test results that may optimize the DR decision over processing variations, for example.

The value stored in cells W0, W1, W2 and Wc may not exactly match the intended written value of the logical bit due to probabilistic write behavior soon after the write operation or due to data retention loss long after the write operation. The probability of the majority of c cells/logical-bit exhibiting such problems is lower than in a conventional one cell/logical-bit design.

According to one embodiment, DR is determined by the output of one of the weight comparators d without regard to storage differences between logical values. Then, the value of DR may be characterized by a statistical mode of the bits stored in c cells 303. The statistical mode is the value that occurs most frequently in the bits stored in the selected c cells. For c cells assigned per logical bit, there are $2^C$ possible permutations of the W0-Wc logical values stored on the cells. The logical value of DR may be assigned to each of the $2^C$ permutations of W0-Wc in the form of a logic truth table implemented by one of the weight comparators d. A statistical mode assignment rule for the logical value of DR is defined as follows. For each permutation, the value of DR is assigned to equal the value that occurs most frequently in the bits stored in the Wc values in that permutation. For example, DR is assigned a logic "0" or bit 0 if most of the Wc correspond to logic "0". Conversely, DR is assigned a "1" or bit 1 if most of the Wc correspond to "1". The assignment rule may provide an equal number of permutations assigned to a "1" as to a "0" and ignores storage errors in a minority of the c cells. In other words, the predefined rule may give equal weight to bits stored as a 1 and bits stored as a 0.

In some technologies, like STT-RAM, one logical value may be harder to write or store than the other logical value. For example, logic "1" may be harder to store than a "0". According to one embodiment, the predefined rule is characterized by a first weight assigned to bits 1 and a second weight assigned to bits 0. DR may be determined by the output of one of the weight comparators d if one of the values of the logical bit is harder to store in the cell than the other. The predefined rule for the first weight assigned to bits 1 and the second weight assigned to bits 0 is defined as follows. The logical value of DR for the easier to store value is assigned to permutations that have a majority, or supermajority, of the Wc values corresponding to the easier to store value. The logical value of DR for the harder to store logical value is assigned to the remaining permutations. Thus, the predefined rule may give unequal weights to bits stored as a 1 and bits stored as a 0. For example, DR is assigned a "0" if a majority, or supermajority, of the Wc correspond to "0" and a "0" is easier to store than a "1". One of the weight comparators d and its corresponding logic truth table may thus favor the harder to store value in the unequally weighted predefined rule by assigning more of the possible permutations to the logic value of DR that is harder to store in the cell.

A corresponding truth table example is shown in Table 1 below, which assumes a "1" is harder to store in the cells than a "0" and c is four. Accordingly, there are sixteen total permutations of W0-W3. The weighting condition includes five permutations that each store a "0" in three or more cells, and eleven permutations that each store a "1" in two or more cells. The decision implementation allows one of the four cells that is supposed to store a "0" to be in error but allows up to two of the four cells that is supposed to store a "1" to be in error. The unequally weighted predefined rule favors the harder to store logic value of "1". Thus, it is easier to store a "1" in the four cells than a "0". The logical complement of Table 1 would similarly favor the opposite condition if a "0" is harder to store in the cells than a "1".

TABLE 1

| W3 | W2 | W1 | W0 | DR |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 1 |
| 0 | 1 | 1 | 0 | 1 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

Figure 11:
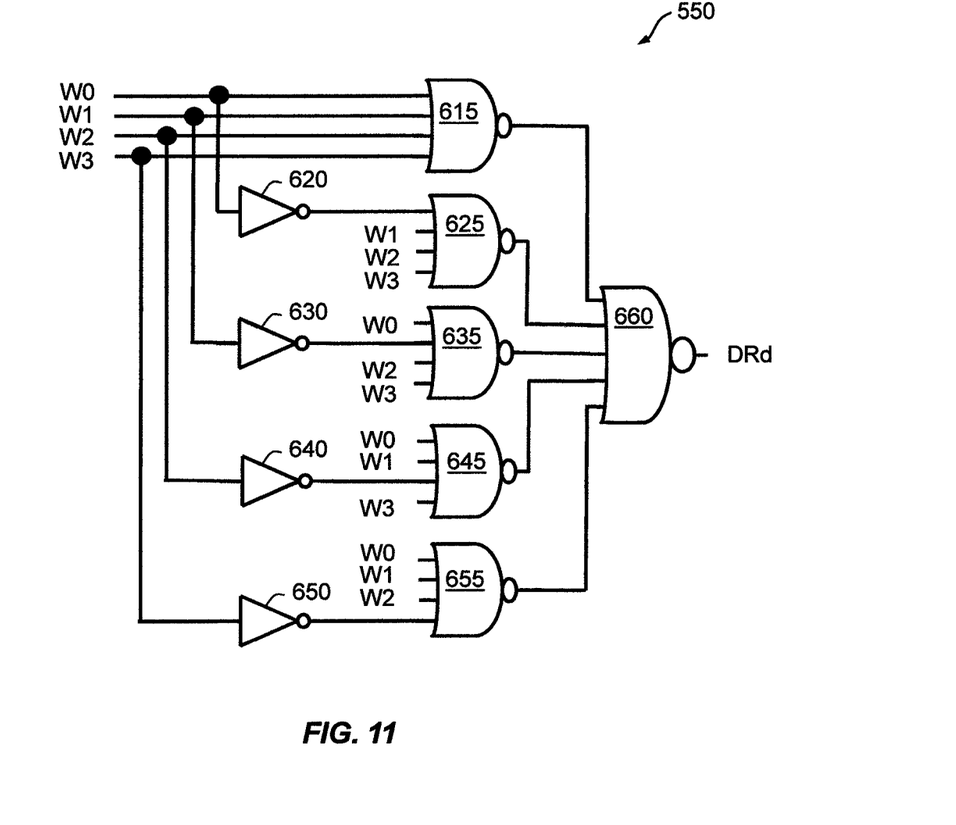
FIG. 11 is a schematic representation of a logic circuit within the program bit register weight comparator circuit of FIG. 10, in accordance with one embodiment of the present invention.

FIG. 11 is a schematic representation of a logic circuit 550 within PBRWC circuit 390, in accordance with one embodiment of the present invention. Logic circuit 550 corresponds to one of the weight comparators d 550 and includes NOR gates 615, 625, 635, 645, 655 and 660, and inverters 620, 630, 640 and 650. Signal lines W0-W3 from the SAc are coupled directly and through the inverters to NOR gates 615, 625, 635, 645 and 655, which couple to NOR gate 660, which are adapted to implement the logic function described in Table 1 at the output, DRd. Many alternative logic circuit embodiments may be used to implement the truth tables described in the tables herein, the embodiment shown in FIG. 11 may, for example, be implemented with NAND instead of NOR gates.

According to one embodiment, DR is determined by the output of one of the weight comparators d if both values of the logical bit are equally harder to store in the cell. Then, the decision in one of the weight comparators d may be characterized by the statistical mode of the values stored in the c cells with equal weighting. The equal weighting rule and its corresponding logic truth table may use an odd number for c. For example, if c is three, there are eight possible permutations which may be equally weighted. Any one bit out of three may be allowed to have a storage error. A corresponding truth table example is shown in Table 2 below. The weighting is equal since four permutations each store a "0" in two or more cells, and four permutations each store a "1" in two or more cells. This logic truth table may be implemented using logic circuit 550 with the W3 circuit path eliminating or ignored within one of the weight comparators d.

TABLE 2

| W2 | W1 | W0 | DR |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |

TABLE 2-continued

| W2 | W1 | W0 | DR |
|---|---|---|---|
| 1 | 1 | 0 | 1 |
| 1 | 1 | 1 | 1 |

According to one embodiment, DR is determined by the output of one of the weight comparators d if one of the values of the logical bit is much harder to store in the cell than the other. Then, the value of DR may be characterized by a severely weighted supermajority of the values stored in the c cells. A corresponding truth table example is shown in Table 3 below, which assumes a "1" is much harder to store in the cells than a "0" and c is three. Accordingly, the weighting condition includes one permutation that stores a "0" in three cells, and seven permutations that each store a "1" in one or more cells. The predefined rule allows one of the four cells that is supposed to store a "0" to be in error but allows up to two of the four cells that is supposed to store a "1" to be in error. The severely unequally weighted predefined rule greatly favors the much harder to store logic value "1". Thus, it is much easier to store a "1" in the three cells than a "0". The logical complement of Table 3 would similarly favor the opposite condition if a "0" is much harder to store in the cells than a "1".

TABLE 3

| W2 | W1 | W0 | DR |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 1 |

According to one embodiment, DR is determined by the output of one of the weight comparators d if one of the values of the logical bit is harder to store in the cell than the other but with less difficulty than the example described in Table 3 above. A corresponding logic truth table is shown in Table 4 below, which again assumes a "1" is harder to store in the cells than a "0" and the value of c is two. In this case the W3 and W2 paths in one of the weight comparators d are eliminating or ignored. Alternatively, the memory density of the system may be optimized by designing the system with just two cells assigned per logical bit. Accordingly, the weighting condition includes one permutation that stores a "0" in two cells, and three permutations that each store a "1" in one or more cells. This example allows none of the two cells that is supposed to store a "0" to be in error but allows one of the two cells that is supposed to store a "1" to be in error. The logical complement of Table 3 would similarly favor the opposite condition if a "0" is much harder to store in the cells than a "1".

TABLE 4

| W1 | W0 | DR |
|---|---|---|
| 0 | 0 | 0 |
| 0 | 1 | 1 |
| 1 | 0 | 1 |
| 1 | 1 | 1 |

The embodiments described herein do not require encoding or other special logic operations to be performed on the logical bit during write operations as is required if using common ECC techniques. Thus, write performance is faster and circuit complexity is reduced using the embodiments in comparison to ECC techniques. Notwithstanding, the embodiments herein are compatible and may be used in conjunction with ECC, redundant repair or other common memory improvement techniques.

The above embodiments of the present invention are illustrative and not limitative. Various alternatives and equivalents are possible. The embodiments of the present invention are not limited by the type or the number of the magnetic random access memory cells used in a memory array. Nor are the embodiments of the present invention limited by the memory circuits being used to write data during write operation. The embodiments of the present invention are not limited by the type of transistor, PMOS, NMOS or otherwise, used to select a magnetic tunnel junction device. The embodiments of the present invention are not limited by the type of logic gates, NOR or NAND used to implement logic truth tables to decide the value of the logical bit stored in the cells. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture a memory. The embodiments described herein have been directed to memory circuits that ignore storage errors but are not limited thereto. The embodiments described herein may be used wherever storing data in memory cells is subject to lengthy probabilistic writing behavior or improving data retention may be found useful.

What is claimed is:

1. A memory circuit comprising:
    a write circuit adapted to provide a same bit to each of a plurality of memory cells for storage, each of the plurality of memory cells storing either the bit or a complement of the bit in response; and
    a read circuit adapted to receive the bits stored in the plurality of memory cells and to generate an output value defined by the stored bits in accordance with a predefined rule,
    wherein the predefined rule is characterized by a first weight assigned to bits 1 and a second weight assigned to bits 0.

2. The memory circuit of claim 1 wherein the predefined rule is characterized by a statistical mode of the bits stored in the plurality of memory cells.

3. The memory circuit of claim 1 further comprising:
    a word-line; and
    a plurality of columns wherein each of the plurality of memory cells is coupled to the word-line and to corresponding ones of the plurality of columns.

4. The memory circuit of claim 3 wherein each of the plurality of columns includes a first signal line and a second signal line, and one of the plurality of memory cells comprises (i) a first current carrying terminal coupled to the first signal line, (ii) a second current carrying terminal coupled to the second signal line and (iii) a control terminal coupled to the word-line.

5. The memory circuit of claim 4 wherein one of the plurality of memory cells further comprises:
    a magnetic tunnel junction having a first terminal coupled to the first current carrying terminal of one of the plurality of memory cells; and
    a first transistor having (i) a first current carrying terminal coupled to the second current carrying terminal of one of the plurality of memory cells, (ii) a gate terminal coupled to the control terminal of one of the plurality of memory cells and (iii) a second current carrying terminal coupled to a second terminal of said magnetic tunnel junction.

6. The memory circuit of claim 1 wherein one of said plurality of memory cells is a DRAM, SRAM, ROM, PROM, EEPROM, FLASH, FeRAM, PRAM, MRAM, ReRAM, STT-MRAM, or ReRAM (resistive RAM) cell.

7. The memory circuit of claim 1 wherein the output value is generated by one of a plurality of selectable logic circuits and the selection of the logic circuit is made by a program input.

8. The memory circuit of claim 7 wherein the non-selected ones of the plurality of selectable logic circuits are powered down.

9. The memory circuit of claim 1 further comprising a plurality of sense amplifiers wherein each of the plurality of memory cells is coupled to corresponding ones of the plurality of sense amplifiers and the output of each of the plurality of sense amplifiers is coupled to the input of a logic circuit.

10. The memory circuit of claim 9 wherein (i) each of the plurality of memory cells is coupled to a first current carrying terminal of a corresponding first transistor, (ii) a second current carrying terminal of the corresponding first transistor is coupled to the input of the corresponding ones of the plurality of sense amplifiers and (iii) a control terminal of each of the corresponding first transistors is coupled to a first signal line.

11. The memory circuit of claim 1 wherein the plurality of memory cells are adjacently located.

12. The memory circuit of claim 1 wherein the plurality of memory cells are non-adjacently located.

13. The memory circuit of claim 1, further comprising:
    a plurality of groups of c physical cells, wherein c bit values associated with the c physical cells of each group form a logical bit;
    a plurality of groups of c n-channel select transistors, each of the c n-channel select transistors of each group being coupled to a corresponding one of the c physical cells; and
    a program bit register weight comparator coupled to the plurality of groups of c n-channel select transistors, the program bit register weight comparator being adapted to generate the predefined rule characterized by the first weight assigned to the bits 1 and the second weight assigned to the bits 0.

14. The memory circuit of claim 13, wherein the program bit register weight comparator further comprises:
    a program bit register; and
    a plurality of d weight comparators coupled to the program bit register, each of the weight comparators adapted to receive a corresponding one of d signals from the program bit register, and adapted to receive the c bit values associated with the c physical cells.

15. The memory circuit of claim 14, wherein each of the plurality of d weight comparators further comprises:
    1st through cth logic gates, each of the 1st through cth logic gates adapted to receive at least one inverted bit value from among the c bit values associated with the c physical cells, and adapted to receive at least one non-inverted bit value from among the c bit values associated with the c physical cells;
    an input logic gate adapted to receive non-inverted bit values from among the c bit values associated with the c physical cells; and
    an output logic gate coupled to the 1st through cth logic gates and to the input logic gate, and adapted to transmit a weighted output.

16. A method of operating a memory circuit, the method comprising:
- providing a same bit to each of a plurality of memory cells, each of the plurality of memory cells storing either the bit or a complement of the bit in response;
- receiving the bits stored in the plurality of memory cells;
- generating an output value defined by the stored bits in accordance with a predefined rule; and
- characterizing the predefined rule by a first weight assigned to bits 1 and a second weight assigned to bits 0.

17. The method of claim 16 further comprising characterizing the predefined rule by a statistical mode of the bits stored in the plurality of memory cells.

18. The method of claim 16 further comprising:
- coupling the plurality of memory cells to a word-line and to corresponding ones of a plurality of columns.

19. The method of claim 18 further comprising:
- forming each of the plurality of columns from a first signal line and a second signal line;
- coupling a first current carrying terminal of one of the plurality of memory cells to the first signal line;
- coupling a second current carrying terminal of one of the plurality of memory cells to the second signal line; and
- coupling a control terminal of one of the plurality of memory cells to the word-line.

20. The memory circuit of claim 19 further comprising;
- coupling a first terminal of a magnetic tunnel junction to the first current carrying terminal of one of the plurality of memory cells;
- coupling a first current carrying terminal of a first transistor to the second current carrying terminal of one of the plurality of memory cells;
- coupling a gate terminal of the first transistor to the control terminal of one of the plurality of memory cells; and
- coupling a second current carrying terminal of the first transistor to a second terminal of the magnetic tunnel junction.

21. The method of claim 16 further comprising providing one of said plurality of memory cells as a DRAM, SRAM, ROM, PROM, EEPROM, FLASH, FeRAM, PRAM, MRAM, STT-MRAM, or ReRAM (resistive RAM) cell.

22. The method of claim 16 further comprising generating the output value by selecting one of a plurality of selectable logic circuits and selecting the logic circuit by a program input.

23. The method of claim 22 further comprising powering down the non-selected ones of the plurality of selectable logic circuits.

24. The method of claim 16 further comprising:
- coupling each of the plurality of memory cells to corresponding ones of a plurality of sense amplifiers; and
- coupling the output of each of the plurality of sense amplifiers to the input of a logic circuit.

25. The method of claim 24 further comprising:
- coupling each of the plurality of memory cells to a first current carrying terminal of a corresponding first transistor; and
- coupling a second current carrying terminal of the corresponding first transistor to the input of the corresponding ones of the plurality of sense amplifiers;
- coupling a control terminal of each of the corresponding first transistors to a first signal line.

26. The method of claim 16 further comprising locating the plurality of memory cells adjacently.

27. The method of claim 16 further comprising locating the plurality of memory cells non-adjacently.

* * * * *